US012674097B2

(12) United States Patent　　(10) Patent No.: US 12,674,097 B2
Bilodeau et al.　　　　　　　　(45) Date of Patent:　Jul. 7, 2026

(54) METHOD FOR ETCHING POLYSILICON

(71) Applicant: ENTEGRIS, INC., Billerica, MA (US)

(72) Inventors: Steven M. Bilodeau, Fairfield, CT (US); Daniela White, Ridgefield, CT (US)

(73) Assignee: ENTEGRIS, INC., Billerica, MA (US)

( * ) Notice: Subject to any disclaimer, the term of this patent is extended or adjusted under 35 U.S.C. 154(b) by 195 days.

(21) Appl. No.: 18/211,220

(22) Filed: Jun. 16, 2023

(65) Prior Publication Data

US 2023/0407176 A1　　Dec. 21, 2023

Related U.S. Application Data

(60) Provisional application No. 63/352,917, filed on Jun. 16, 2022.

(51) Int. Cl.
*C09K 13/00*　　(2006.01)
*C09K 13/06*　　(2006.01)
*H10P 50/64*　　(2026.01)
*H10P 50/66*　　(2026.01)

(52) U.S. Cl.
CPC .............. *C09K 13/00* (2013.01); *C09K 13/06* (2013.01); *H10P 50/642* (2026.01); *H10P 50/667* (2026.01)

(58) Field of Classification Search
None
See application file for complete search history.

(56) References Cited

U.S. PATENT DOCUMENTS

| | | | |
|---|---|---|---|
| 5,518,966 A | 5/1996 | Woo | |
| 2018/0337253 A1 | 11/2018 | Bilodeau et al. | |
| 2019/0278184 A1 | 9/2019 | Cao et al. | |
| 2020/0035485 A1* | 1/2020 | Chen .................... | C11D 3/0073 |
| 2020/0157422 A1 | 5/2020 | Liu et al. | |
| 2020/0190673 A1 | 6/2020 | Lippy | |

(Continued)

FOREIGN PATENT DOCUMENTS

| | | |
|---|---|---|
| JP | 2012238849 A | 12/2012 |
| JP | 2013008900 A | 1/2013 |

(Continued)

OTHER PUBLICATIONS

Anoop Prakash A B, et al., A Review of various Wet Etching Techniques used in Micro Fabrication for Real Estate Consumption, International Journal of Computer Applications (0975-8887), International Conference on Innovations in Intelligent Instrumentation, Optimization and Signal Processing, "ICIIIOSP-2013," Accessed Aug. 5, 2017, https://pdfs.semanticscholar.org/cf79/289f84df456abf49ba0c6b886c3cca7b74e9.pdf.

(Continued)

*Primary Examiner* — Jiong-Ping Lu

(57) ABSTRACT

The invention provides compositions useful in the etching of polysilicon in the presence of silicon oxide and silicon nitride. The compositions comprise choline hydroxide, an oxidizing agent such as periodic acid, and optionally a surfactant, and are useful in the etching of polysilicon in general, and in particular in both the operation of polysilicon trim as well as polysilicon exhume. The utilization of an added oxidizing agent was found to reduce selectivity of silicon etching based on the silicon crystal orientation, which was found to reduce roughness and the presence of residual silicon residues, such as silicon (111) residues after the etching step.

9 Claims, 7 Drawing Sheets

(56) References Cited

U.S. PATENT DOCUMENTS

| | | | | | |
|---|---|---|---|---|---|
| 2023/0121639 | A1* | 4/2023 | Hong | .......................... | C23F 1/38 |
| | | | | | 252/79.4 |
| 2023/0313041 | A1* | 10/2023 | Dinega | .................. | C09K 13/00 |
| | | | | | 438/753 |

FOREIGN PATENT DOCUMENTS

| | | | |
|---|---|---|---|
| JP | 2013135081 A | 7/2013 | |
| JP | 2021034634 A | 3/2021 | |
| JP | 2021136429 A | 9/2021 | |
| KR | 20180041365 A | 4/2018 | |
| TW | 201001099 A | 1/2010 | |
| WO | 200133767 A2 | 5/2001 | |
| WO | 2017126554 A1 | 7/2017 | |
| WO | 2020252272 A1 | 12/2020 | |

OTHER PUBLICATIONS

K. Biswas et al., "Etch characteristics of KOH, TMAH and dual doped TMAH for bulk micromachining of silicon," Microelectronics Journal, vol. 37, No. 6, pp. 519-525, Jun. 2006, doi: 10.1016/j.mejo.2005.07.012.

Valentina Korchnoy, Investigation of Choline Hydroxide for Selective Silicon Etch from a Gate Oxide Failure Analysis Standpoint, Intel Israel (74) Ltd., Haifa, Israel, pp. 1-9.

Marcus Lippold, et al., HF-HNO3-H2SO4/H2O Mixtures for Etching Multicrystalline Silicon Surfaces: Formation of NO2+, Reaction Rates and Surface Morphologies, Z. Naturforsch, 2011, 66b, pp. 155-163.

M. H. Jones, et al., Wet-chemical etching and cleaning of silicon, Fredericksburg, Va., Virginia Semiconductor, 2003.

R. B. Darling, EE-527: MicroFabrication—Wet Etching (33 pages).

K. Tokoro, et al., Anisotropic etching properties of silicon in KOH and TMAH solutions, MHA'98, 1998 International Symposium on Micromechatronics and Human Science, Creation of New Industry, Cat. No.98TH8388, Nagoya, Japan, 1998, pp. 65-70, doi: 10.1109/MHS.1998.745752.

P. Pal, et al., Anisotropic etching in low-concentration KOH: effects of surfactant concentration, Micro &, Nano Letters, vol. 10, No. 4, pp. 224-228, Apr. 2015, doi: 10.1049/mnl.2014.0685.

* cited by examiner a) POLYSILICON EXHUME

SILICON OXIDE →

SILICON NITRIDE →

POLYSILICON →

SILICON → b) POLYSILICON TRIM

SILICON OXIDE →

SILICON NITRIDE →

POLYSILICON →

SILICON →

METHOD FOR ETCHING POLYSILICON

RELATED FILINGS

The disclosure claims priority to U.S. provisional patent No. 63/352,917 with a filing date of Jun. 16, 2022. The priority document is hereby incorporated by reference.

TECHNICAL FIELD

The invention relates generally to compositions and methods for selectively etching polysilicon films in the presence of silicon nitride and silicon oxide films.

BACKGROUND

Processing semiconductor and microelectronic devices involves various steps of depositing layers of materials and removing materials by chemical processes referred to as "etching." By etching, a thin mask layer is placed over a layer of deposited material. Openings are then formed in the mask and select portions of the substrate are exposed. The masked substrate is then contacted with an etchant, which contacts material of the underlying substrate through the openings in the mask and chemically degrades and removes the material of the substrate to form openings (three-dimensional spaces) in the substrate.

One such sacrificial material is polysilicon. Typical methods of removal of polysilicon include dry etching and wet etching methods. In the case of anisotropic wet etching, bases such as tetramethylammonium hydroxide (TMAH) and alkali metal hydroxides have been used. However, any residual alkali metal ions are not desired at the surface of the final device product, and TMAH is not preferred as it is a neurotoxin. Additionally, TMAH and KOH also exhibit higher etch rates for n-doped polysilicon over p-doped polysilicon; this phenomenon is undesired since removal rates for all polysilicon species is essential for certain applications where multiple polysilicon surfaces are present.

Accordingly, there is a continuing need for etching compositions for the removal of polysilicon materials from microelectronic device substrates, especially the selective removal of polysilicon in such device substrates which also contain silicon nitride and silicon oxide surfaces.

SUMMARY

In summary, the invention provides compositions useful in the etching of polysilicon in the presence of silicon oxide and silicon nitride. The compositions comprise choline hydroxide, an oxidizing agent such as periodic acid, and optionally a surfactant, and are useful in the etching of polysilicon in general, and in particular in both the operation of polysilicon trim as well as polysilicon exhume. The utilization of an added oxidizing agent was found to reduce selectivity of silicon etching based on the silicon crystal orientation, which was found to reduce roughness and the presence of residual silicon residues, such as silicon (111) residues after the etching step. In certain embodiments, the device substrate contains polysilicon, silicon nitride, and silicon oxide surfaces and the etching selectivity of polysilicon over silicon nitride and silicon oxide is greater than about 1000:1.

In some applications 1-10 microns of polysilicon is fully removed from a trench. For these applications high removal rates are required, so that the process is accomplished in an acceptable time. Temperatures between 30° C. and 90° C.

can be used to achieve rates greater than 100 Å/minute and process times between 15 and 360 minutes.

In other applications it is desirable to partially remove polysilicon from a microelectronic device. In this case as little as 50 Å may be removed. Removal rates in the range of 10-100 Å/minute are desired to facilitate control of the amount removed. These lower rates can be achieved by processing at a lower temperature and by control of the etching formulation composition.

The compositions of the invention also serve to avoid the use of TMAH, which is known to be a neurotoxin, and the use of alkali metal hydroxides such as KOH which can contaminate the surface with mobile ions.

DETAILED DESCRIPTION

Figure 1:
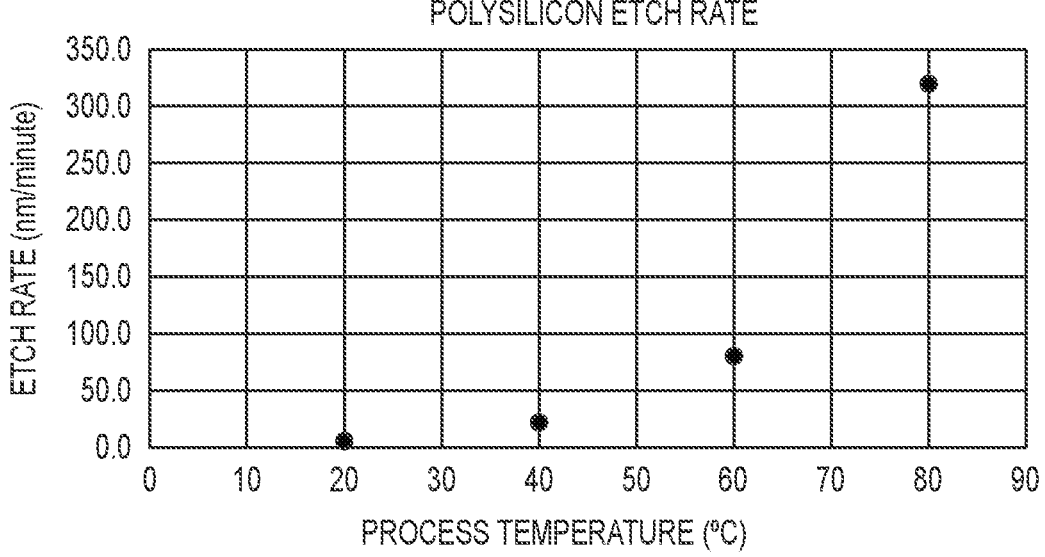
FIG. 1 is a plot of polysilicon etch rate versus process temperature for a composition consisting of 14.5 weight percent choline hydroxide in water.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5). In a first aspect, the invention provides a composition comprising:

a. choline hydroxide;

b. water;

c. an oxidizing agent; and optionally d. a surfactant.

In certain embodiments, the oxidizing agent is chosen from oxidizing agents such as iodates and periodic acid, permanganates, and persulfates. In one embodiment, the oxidizing agent is present in an amount of no greater than about 15 weight percent. In another embodiment, the oxidizing agent is periodic acid and is present in an amount of about 0.1 to about 1 weight percent, based on the total weight of the composition.

In one embodiment, the iodine-containing oxidizing agent is chosen from $H_5IO_6$, $HIO_4$, or a mixture thereof.

In certain embodiments, the composition further comprises at least one surfactant. As used herein the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. When present, surfactants for use in the compositions described herein include, but are not limited to, amphoteric salts, cationic surfactants, anionic surfactants, zwitterionic surfactants, non-ionic surfactants, and combinations thereof. Exemplary surfactants include decylphosphonic acid, dodecylphosphonic acid (DDPA), dodecylbenzenesulfonic acid (DDB SA), other $R^1$ benzene sulfonic acids or salts thereof (where the $R^1$ is a straight-chained or branched $C_8$-$C_{18}$ alkyl group). Non-ionic surfactants include, but are not limited to, polyoxyethylene lauryl ether, dodecenylsuccinic acid monodiethanol amide, ethylenediamine tetrakis (ethoxylate-block-propoxylate) tetrol, polyethylene glycols, polypropylene glycols, polyethylene or polypropylene glycol ethers, block copolymers based on ethylene oxide and propylene oxide, polyoxypropylene sucrose ether, t-octylphenoxypolyethoxyethanol, 10-ethoxy-9,9-dimethyldecan-1-amine, Polyoxyethylene (9) nonylphenylether, branched, Polyoxyethylene (40) nonylphenylether, branched, dinonylphenyl polyoxyethylene, nonylphenol alkoxylates, polyoxyethylene sorbitol hexaoleate, polyoxyethylene sorbitol tetraoleate, polyethylene glycol sorbitan monooleate, sorbitan monooleate, alcohol alkoxylates, alkyl-polyglucoside, ethyl perfluorobutyrate, 1,1,3,3,5,5,5-hexamethyl-1,5-bis[2-(5-norbornen-2-yl)ethyl]trisiloxane, monomeric octadecylsilane derivatives, siloxane modified polysilazanes, silicone-polyether copolymers, and ethoxylated fluorosurfactants. Cationic surfactants include, but are not limited to, cetyl trimethylammonium bromide (CTAB), heptadecanefluorooctane sulfonic acid, tetraethylammonium, stearyl trimethylammonium chloride, 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide, di(hydrogenated tallow)dimethylammonium chloride, and polyoxyethylene (16) tallow ethylmonium ethosulfate. Anionic surfactants contemplated include, but are not limited to, poly(acrylic acid sodium salt), ammonium polyacrylate, sodium polyoxyethylene lauryl ether, sodium dihexylsulfosuccinate, sodium dodecyl sulfate, dioctylsulfosuccinate salt, 2-sulfosuccinate salts, 2,3-dimercapto-1-propanesulfonic acid salt, dicyclohexyl sulfosuccinate sodium salt, sodium 7-ethyl-2-methyl-4-undecyl sulfate, phosphate fluorosurfactants, fluorosurfactants, and poly acrylates. Zwitterionic surfactants include, but are not limited to, acetylenic diols or modified acetylenic diols, ethylene oxide alkylamines, N,N-dimethyldodecylamine N-oxide, sodium cocaminpropinate, 3-(N,N-dimethylmyristylammonio)propanesulfonate, and (3-(4-heptyl)phenyl-3-hydroxypropyl)dimethylammoniopropanesulfonate. In one embodiment, the surfactant is polyethylene glycol p-(1,1,3,3-tetramethylbutyl)phenyl ether.

The amount of surfactant in an etching composition can be an amount that, in combination with the other materials of an etching composition, will provide desired overall performance. For example, the composition can contain an amount of surfactant that may be in a range from about 0.001 to about 10 weight percent.

In certain embodiments, the composition further comprises one or more amines, in particular, amines such as primary and secondary amines. Exemplary amines include Diethylenetriamine (CAS #: 111-40-0), Triethylenetetraamine (CAS #:112-24-3), Tetramethylenepentaamine (CAS #: 112-57-2), Piperazine (CAS #: 110-85-0), and Piperidine (CAS #: 110-89-4)

As used herein, the term "microelectronic device" (or "microelectronic device substrate," or simply "substrate") is used in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term "microelectronic device" can refer to any in-process microelectronic device or microelectronic device substrate that contains or is being prepared to contain functional electronic (electrical-current-carrying) structures, functional semiconductor structures, and insulating structures, for eventual electronic use in a microelectronic device or microelectronic assembly.

As used herein, the term "silicon nitride" is given a meaning that is consistent with the meaning of the term as used in the microelectronics and semiconductor fabrication industries. Consistent therewith, silicon nitride refers to materials including thin films made of amorphous silicon nitride with commercially useful low levels of other materials or impurities and potentially some variation around the nominal stoichiometry of $Si_3N_4$. The silicon nitride may be present as part of a microelectronic device substrate as a functioning feature of the device, for example as a barrier layer or an insulating layer, or may be present to function as a material that facilitates a multi-step fabrication method for preparing a microelectronic device.

As used herein, the term "silicon oxide" is given a meaning that is consistent with the meaning of the term as used in the microelectronics and semiconductor fabrication industries. Consistent therewith, silicon oxide refers to thin films made of silicon oxide $SiO_x$ with x between 1 and 2. The silicon oxide can be placed on the substrate by any method, such as by being deposited by chemical vapor deposition from TEOS or another source, or by oxidation of silicon. The silicon oxide can advantageously contain a commercially useful low level of other materials or impurities. The silicon oxide may be present as part of a microelectronic device substrate as a feature of the microelectronic device, for example as an insulating layer.

As used herein, "polysilicon" or polycrystalline Si or poly-Si is understood by the person skilled in the art to be a polycrystalline form of silicon consisting of multiple small silicon crystals. It is typically deposited using low-pressure chemical vapor deposition (LPCVD) and is often doped n-type polysilicon or p-type polysilicon. The extent of doping can vary from lightly doped (e.g., in a range from $10^{13}$ cm$^{-3}$ to $10^{18}$ cm$^{-3}$) to heavily doped (e.g., greater than $10^{18}$ cm$^{-3}$), as readily understood by the person skilled in the art. Examples of p-doped material include polysilicon doped with a dopant species from Group IIIA of the Periodic Table, such as boron, aluminum, gallium and/or indium. An n-doped material may for example be polysilicon doped with a dopant species from Group IV (silicon, germanium, or tin) or Group V (phosphorus, arsenic, antimony, or bismuth) of the Periodic Table.

Embodiments of certain etching compositions include compositions in the form of aqueous solutions that comprise, consist essentially of, or consist of: choline hydroxide, an oxidizing agent, in amounts effective to improve etch rate of polysilicon relative to silicon nitride or silicon nitride; and optionally a surfactant. These and other example compositions can comprise, consist of, or consist essentially of the recited ingredients and optional ingredients. As a general convention throughout the present description a composition of matter such as an etching composition as described, or an ingredient or component thereof, that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials.

In certain embodiments, the compositions of the invention do not require and may exclude other types of ingredients not typically included in an etching composition, such as a pH adjusting agent and solid materials such as abrasive.

The compositions of the invention can be prepared by any method that will be useful to produce an etching composition as described. By one method, aqueous or solid ingredients can be combined, optionally with heat, and mixed to uniformity.

In a second aspect, the invention provides a method for etching polysilicon on a microelectronic device having silicon nitride and polysilicon surfaces, the method comprising contacting the device with a composition comprising:
    a. choline hydroxide;
    b. water;
    c. an oxidizing agent; and
    d. optionally a surfactant;
    under conditions effective to etch polysilicon.

In certain embodiments, the microelectronic device substrate will further contain exposed silicon oxide surface(s).

As noted above, the compositions as described can be useful for methods of removing polysilicon from a surface of a microelectronic device substrate. The substrate can contain other materials that are useful in a microelectronic device, such as one or more of an insulator, barrier layer, conducting material, semiconducting material, or a material that is useful for processing a microelectronic device (e.g., photoresist, mask, among others). Example substrates have a surface that includes silicon nitride, oxidized silicon and PETEOS (oxide deposited using plasma enhanced tetraethyl ortho silicate) as well as polysilicon.

In use, the compositions of the invention can provide etching performance that is useful based on commercial performance needs and expectations, and as compared to comparative etching compositions, can provide improved performance with respect to etch rate and selectivity of polysilicon relative to silicon dioxide and silicon nitride.

This method can be performed on known and commercially available equipment. Generally, to etch a substrate to selectively remove a material at a surface of the substrate, etching composition can be applied to the surface and allowed to contact surface structures to selectively remove certain of the structures, chemically.

In an etching step, the composition can be applied to the surface in any suitable manner, such as by spraying the composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains silicon-germanium and silicon. The application may be in a batch or single wafer apparatus, for dynamic or static cleaning.

The conditions (e.g., time and temperature) of a useful etching process can be any that are found to be effective or advantageous. Generally, etching composition is contacted with the surface, such as by submersion in a bath of the etching composition, for a time that is sufficient to selectively remove silicon nitride. The time of exposure to the etching composition and the temperature of the etching composition can be effective for a desired amount of removal of the silicon nitride from a surface of the substrate. The amount of time for an etching step should not be too short, because this means that an etch rate of polysilicon may be too high, which can lead to process control difficulties and reduced quality of a microelectronic device at the end of an etch step. Of course, the amount of time required for an etch step is preferably not unduly long, to allow good efficiency and throughput of an etching process and semiconductor fabrication line. Examples of useful times for a trim operation may be in a range from about 1 minute to about 30 minutes, and for an exhume operation, about 30 minutes to about 360 minutes, at the temperature ranges set forth herein. Such contacting times and temperatures are illustrative, and any other suitable time and temperature conditions may be employed that are efficacious to achieve the required removal selectivity.

An etching step of the present description can be useful to etch polysilicon material from a surface of any type of substrate. Example etching processes can exhibit a significantly increased polysilicon etch rate, and high selectivity relative to silicon oxide and silicon nitride of greater than about 150 and in certain embodiments, at least about 2000 or at least about 4000.

After completion of a desired amount of selective etching of polysilicon, etching composition that remains on a surface of an etched microelectronic device can be removed from the surface by any desired and useful method, such as by a rinse, wash, or other removal step. For example, after etching, a microelectronic device substrate may be rinsed with a rinse of deionized water (e.g., at a temperature in a range from about 20° C. to about 90° C.) followed by drying, e.g., spin-dry, $N_2$, vapor-dry etc. Following the rinse, the substrate surface may be measured for the presence and amount of particles at the surface.

The compositions described herein can be easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the semi-aqueous composition, i.e., more dilute or more concentrated, and it will be appreciated that the semi-aqueous compositions can variously and alternatively comprise, consist or consist essentially of any combination of ingredients consistent with the disclosure herein. Accordingly, in third aspect, the invention provides a kit, including in two or more containers, two or more of choline hydroxide, an oxidizing agent, optionally a surfactant, and optionally an amine.

The containers of the kit must be suitable for storing and shipping said semi-aqueous composition components, for example, NOWPak® containers (Entegris, Inc.) The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high-density polyethylene, can be used to fabricate the liners for said one or more containers. Desirable liner materials are generally processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" and U.S. Pat. No. 6,698,619 entitled "RETURNABLE AND REUS-

ABLE, BAG-IN-DRUM FLUID STORAGE AND DISPENSING CONTAINER SYSTEM".

EXAMPLES

Figure 2:
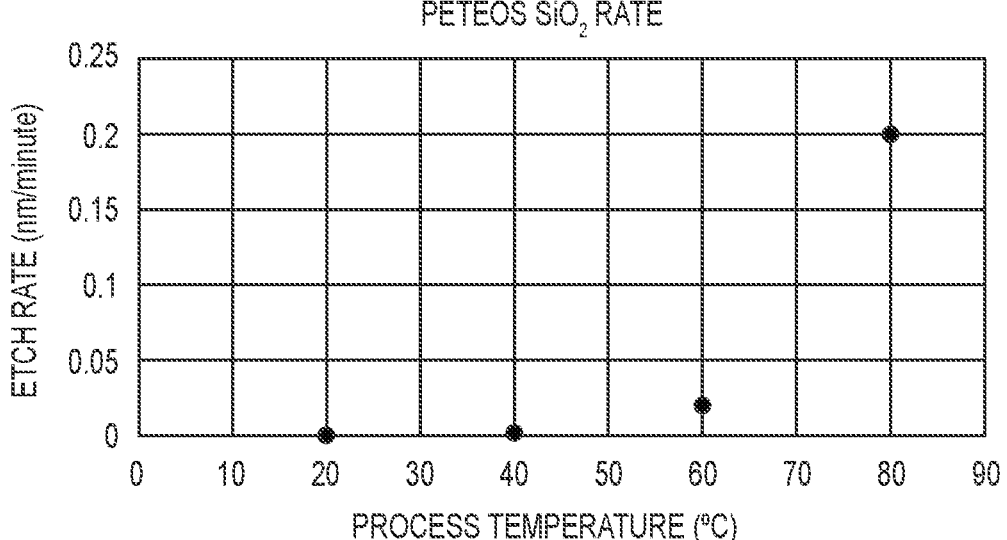
FIG. 2 is a plot of PETEOS etch rate for a composition consisting of 14.5 weight percent choline hydroxide in water.
Figure 3:
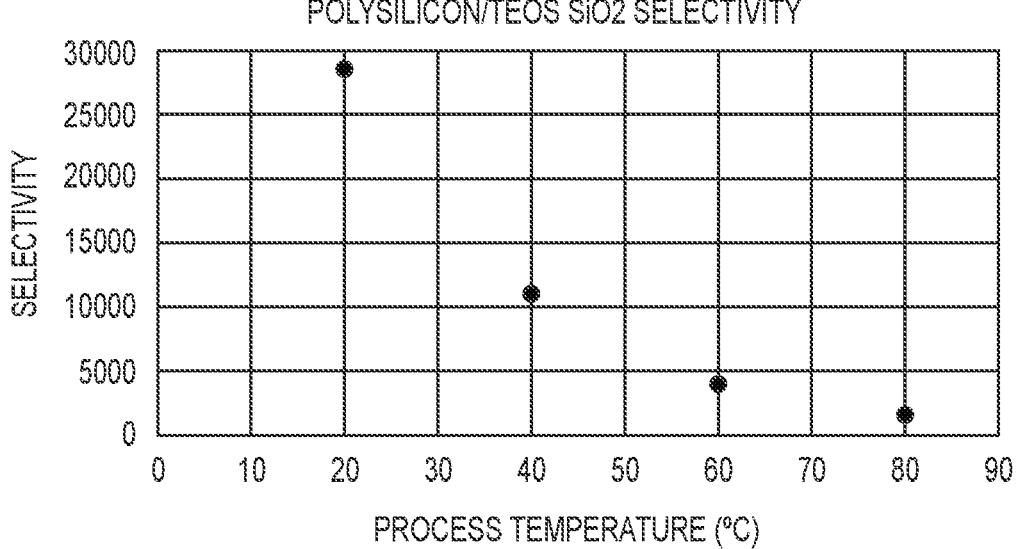
FIG. 3 is a plot of selectivity versus process temperature for a substrate comprised of polysilicon and PETEOS surfaces.

Example 1. Referring to the data presented in FIGS. 1 through 3, a 12.5 weight percent solution of choline hydroxide and water was utilized. Etch rates for polysilicon, silicon oxide and silicon nitride were measured using spectroscopic ellipsometry on blanket films before and after exposure to the choline hydroxide solution.

This data shows that silicon oxide and silicon nitride selectivity is satisfactory at all temperatures (silicon nitride etch rates are <0.1 A/minute at up to 80° C.). The polysilicon etch rate is sufficient for applications that require large amounts of polysilicon removal at T>25° C. For applications that require small amounts of poly silicon removal lower temperatures are preferred so that removal amounts can be adequately controlled.

Figure 4:
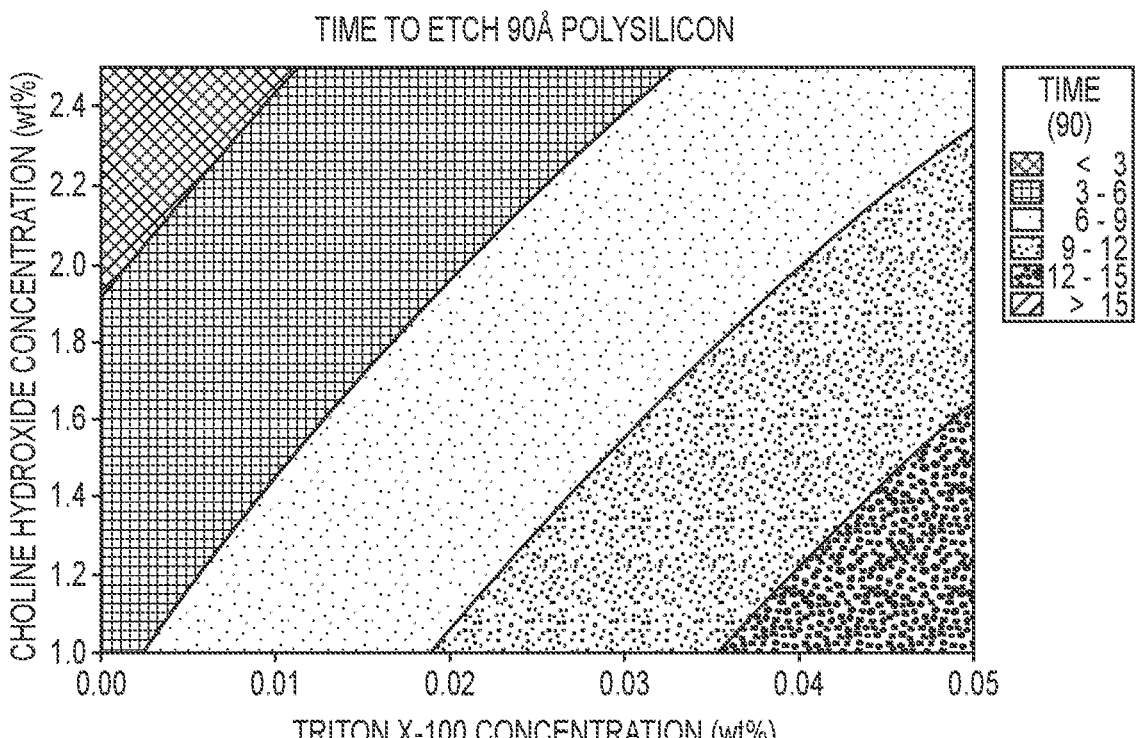
FIG. 4 is a contour plot of the time necessary to etch 90 Å of polysilicon versus choline hydroxide concentration and Triton™ X-100. It shows that the shortest times are needed at low Triton™ X-100 (polyethylene glycol p-(1,1,3,3-tetramethylbutyl)phenyl ether; CAS No. 9002-93-1)(Dow) and high choline hydroxide concentrations.
Figure 5:
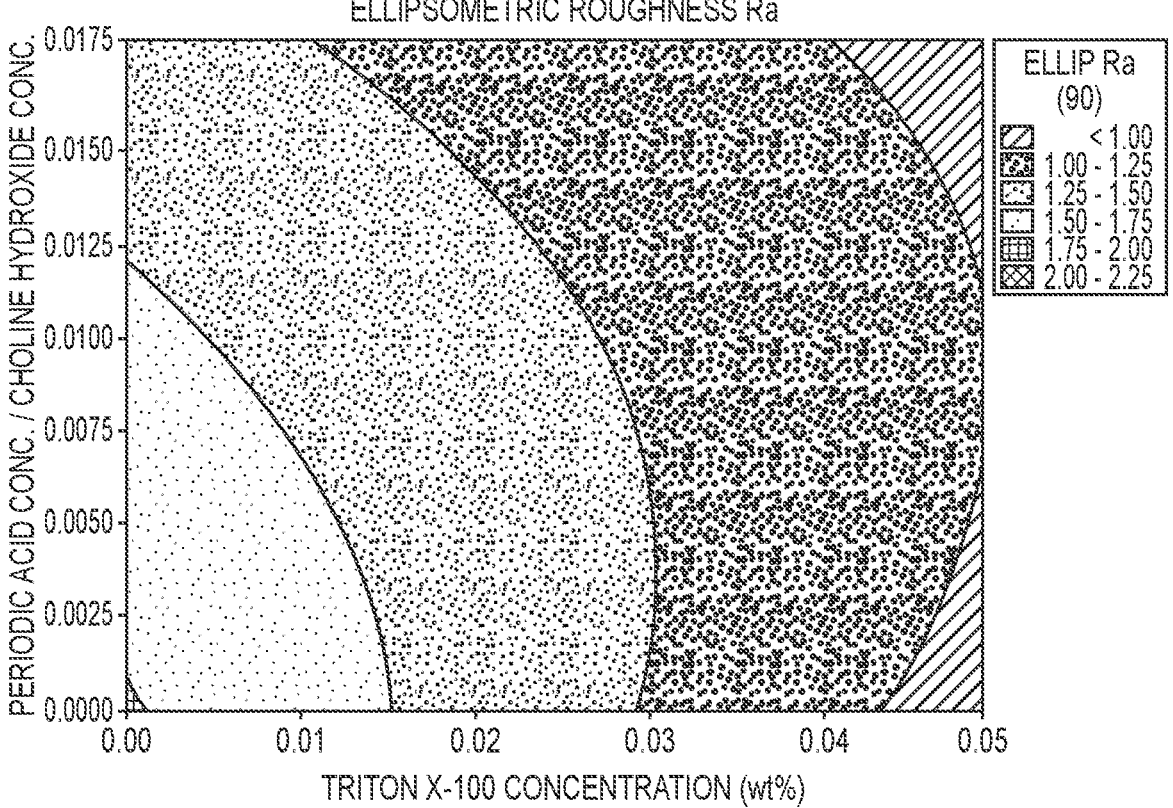
FIG. 5 is a contour plot of roughness (Ra), determined by ellipsometry after etching 90Å of polysilicon, as a function of periodic acid to choline hydroxide ratio and surfactant (Triton™ X-100) concentration. It shows that the polysilicon has lower roughness when higher levels of surfactant (Triton™ X-100) are present in the solution.
Figure 6:
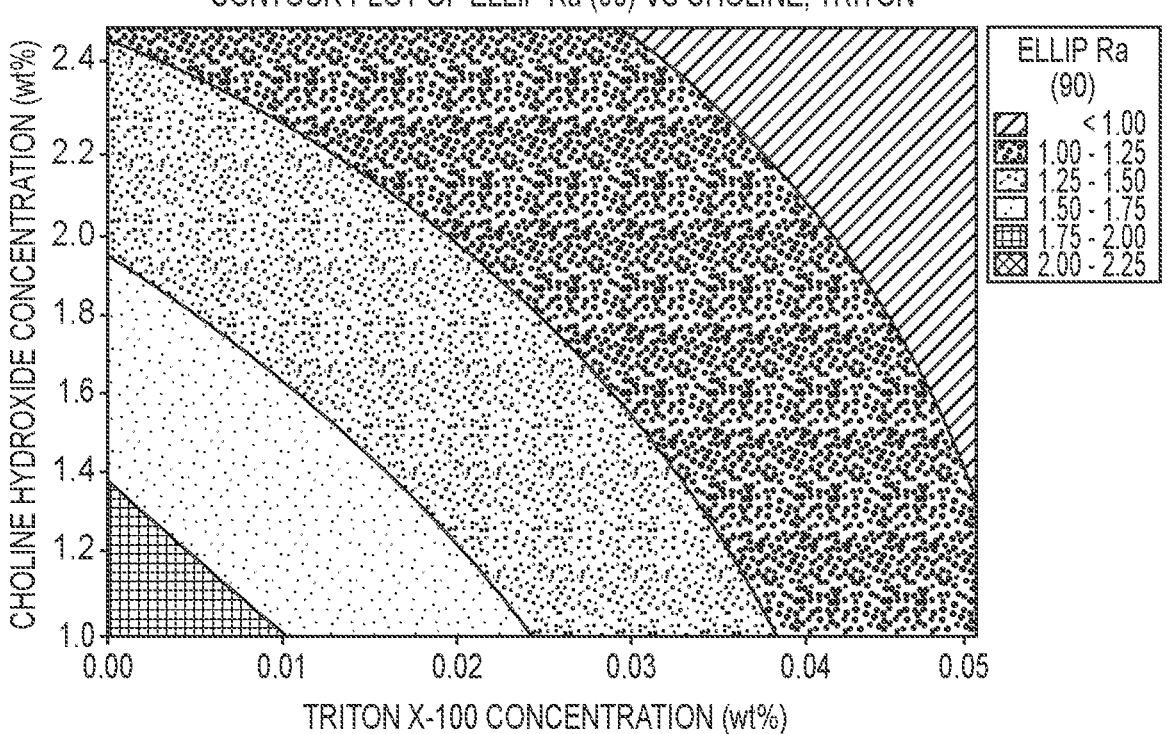
FIG. 6 is a contour plot of roughness (Ra), determined by ellipsometry, after etching of polysilicon as a function of the choline hydroxide and surfactant (Triton™ X-100). It shows that the polysilicon has the lowest roughness after etching in solutions with high choline hydroxide and high Triton™ X-100 concentrations.
Figure 7A:
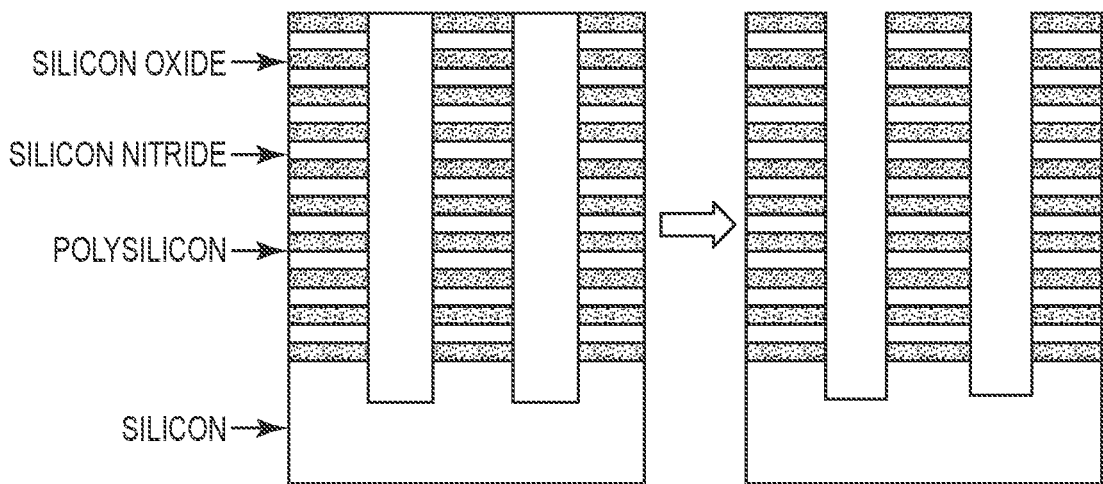
FIG. 7A shows a desired device cross-section for a process where polysilicon is fully removed (polysilicon exhume).
Figure 7B:
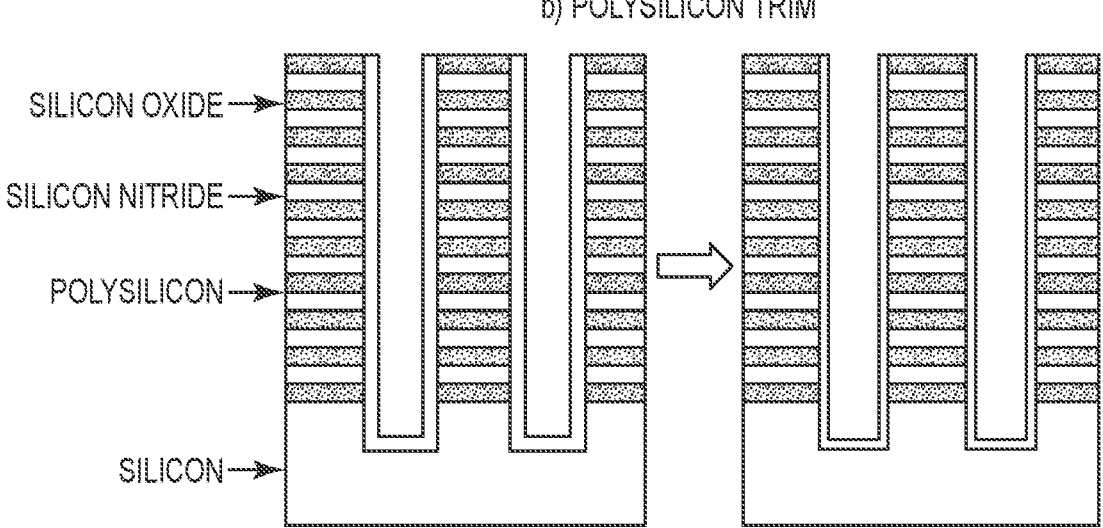
FIG. 7B shows a desired cross-section for a process with partial polysilicon removal (polysilicon trim).

Example 2. Referring to the data presented in FIGS. 4 through 6, a composition of the invention comprising choline hydroxide, periodic acid, and the surfactant Triton™ X-100, was tested at ambient temperature for a polysilicon trim application. The polysilicon etch rates for a range of time periods were measured so that etch times for 90 Å removal could be interpolated. Additionally, the film was processed to remove 90 Å and the roughness (Ra) measured by ellipsometry. This data shows that optimal results were obtained at 2-2.4 weight percent choline hydroxide, 0.04-0.05 weight percent Triton™ X-100, and 0.03-0.045 weight percent periodic acid.

Aspects

In a first aspect, the invention provides a composition comprising:

a. choline hydroxide;

b. water;

c. an oxidizing agent; and d. optionally a surfactant.

In a second aspect, the invention provides the composition of the first aspect, wherein the oxidizing agent is chosen from an iodine-containing oxidizing agent, permangenates, and persulfates.

In a third aspect, the invention provides the composition of the second aspect, wherein the iodine-containing oxidizing agent is chosen from $H_5IO_6$, $HIO_4$, or a mixture thereof In a fourth aspect, the invention provides the composition of any one of the first through the third aspects, wherein the surfactant is present and is a non-ionic surfactant.

In a fifth aspect, the invention provides the composition of any one of the first through the fourth aspects, wherein the surfactant is present and is polyethylene glycol p-(1,1,3,3-tetramethylbutyl)phenyl ether.

In a sixth aspect, the invention provides the composition of any one of the first through the fifth aspects, wherein the oxidizing agent is chosen from $H_5IO_6$, $HIO_4$, or a mixture thereof, and a surfactant is present and is polyethylene glycol p-(1,1,3,3-tetramethylbutyl)phenyl ether.

In a seventh aspect, the invention provides the composition of any one of the first through the sixth aspects, wherein the composition further comprises one or more amines.

In an eighth aspect, the invention provides the composition of the seventh aspect, wherein the amine is chosen from diethylenetriamine, triethylenetetramine, tetramethylenepentaamine, piperazine, and piperidine.

In a ninth aspect, the invention provides the composition of any one of the first through the sixth aspects, which comprises about 2 to about 2.4 weight percent choline hydroxide, about 0.04 to about 0.05 weight percent polyethylene glycol p-(1,1,3,3-tetramethylbutyl)phenyl ether, and about 0.03 to about 0.045 weight percent of periodic acid, based on the total weight of the composition.

In a tenth aspect, the invention provides a method for etching polysilicon on a microelectronic device having silicon nitride and polysilicon surfaces, the method comprising contacting the device with a composition comprising:

a. choline hydroxide;
    b. water;
    c. an oxidizing agent; and
    d. optionally a surfactant;
    under conditions effective to etch polysilicon.

In an eleventh aspect, the invention provides the method of the tenth aspect, wherein the oxidizing agent is chosen from $H_5IO_6$, $HIO_4$, or a mixture thereof, and a surfactant is present and is polyethylene glycol p-(1,1,3,3-tetramethylbutyl)phenyl ether.

In a twelfth aspect, the invention provides the method of the tenth aspect, wherein the composition comprises about 2 to about 2.4 weight percent choline hydroxide, about 0.04 to about 0.05 weight percent polyethylene glycol p-(1,1,3,3-tetramethylbutyl)phenyl ether, and about 0.03 to about 0.045 weight percent of periodic acid.

In a thirteenth aspect, the invention provides the method of the tenth, eleventh, or twelfth aspect, wherein the composition further comprises one or more amines.

In a fourteenth aspect, the invention provides the method of the thirteenth aspect, wherein the amine is chosen from diethylenetriamine, triethylenetetramine, tetramethylenepentaamine, piperazine, and piperidine.

In a fifteenth aspect, the invention provides the method of any one of the tenth through the thirteenth aspects, wherein the method is conducted at a temperature of less than about 30° C.

In a sixteenth aspect, the invention provides the method of any one of the tenth through the thirteenth aspects, wherein the method is conducted at a temperature of about greater than about 30° C. to about 90° C.

In a seventeenth aspect, the invention provides the method of any one of the tenth through the thirteenth aspects, wherein the microelectronic device further comprises a silicon oxide surface, and the etching selectivity of polysilicon over silicon nitride and silicon oxide is greater than about 1000:1.

In an eighteenth aspect, the invention provides the method of any one of the tenth through the thirteenth aspects, wherein the polysilicon is doped with phosphorous.

In a nineteenth aspect, the invention provides the method of any one of the tenth through the thirteenth aspects, wherein only a portion of the polysilicon is removed, and the resulting polysilicon surface has a roughness (Ra) of no greater than about 1 nm as determined by atomic force microscopy (AFM).

In a twentieth aspect, the invention provides a kit, comprising in two or more containers, one or more of choline hydroxide, water, an oxidizing agent, a surfactant, and an amine.

In a twenty-first aspect, the invention provides the kit of the twentieth aspect, wherein the oxidizing agent is chosen from $H_5IO_6$, $HIO_4$, or a mixture thereof, and the surfactant is polyethylene glycol p-(1,1,3,3-tetramethylbutyl)phenyl ether

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A selective etch composition consisting of:
    a. choline hydroxide;
    b. water;
    c. one or more oxidizing agents;
    d. one or more surfactants, including polyethylene glycol p-(1,1,3,3-tetramethylbutyl)phenyl ether; and
    e. optionally one or more amines.

2. The composition of claim 1, wherein the one or more oxidizing agents are chosen from an iodine-containing oxidizing agent, permangenates, and persulfates.

3. The composition of claim 2, wherein the iodine-containing oxidizing agent is chosen from $H_5IO_6$, $HIO_4$, or a mixture thereof.

4. The composition of claim 1, wherein the one or more surfactants are present and include a non-ionic surfactant.

5. The composition of claim 1, wherein the one or more amines are present.

6. The composition of claim 5, wherein the one or more amines are chosen from diethylenetriamine, triethylenetetramine, tetramethylenepentaamine, piperazine, and piperidine.

7. The composition of claim 1, which comprises about 2 to about 2.4 weight percent choline hydroxide, about 0.04 to about 0.05 weight percent polyethylene glycol p-(1,1,3,3-tetramethylbutyl)phenyl ether, and about 0.03 to about 0.045 weight percent of periodic acid, based on the total weight of the composition.

8. A selective etch solution consisting essentially of:
    a. choline hydroxide;
    b. water;
    c. one or more oxidizing agents;
    d. one or more surfactants, including polyethylene glycol p-(1,1,3,3-tetramethylbutyl)phenyl ether; and
    e. optionally one or more amines, wherein the solution selectively etches polysilicon relative to silicon nitride.

9. The composition of claim 1, wherein the composition selectively removes polysilicon relative to silicon nitride.

* * * * *